(12) United States Patent
Overmann et al.

(10) Patent No.: US 7,077,526 B2
(45) Date of Patent: Jul. 18, 2006

(54) MECHANICALLY ADJUSTABLE THERMAL PATH FOR PROJECTION DISPLAY DEVICE COOLING

(75) Inventors: Scott P. Overmann, Wylie, TX (US); John T. McKinley, Plano, TX (US); Clarence A. Martin, Ardmore, OK (US); Jacky D. Grimmett, Carrollton, TX (US); John P. O'Connor, Ft. Worth, TX (US)

(73) Assignee: Texas Instruments Incorporated, Dallas, TX (US)

( * ) Notice: Subject to any disclaimer, the term of this patent is extended or adjusted under 35 U.S.C. 154(b) by 182 days.

(21) Appl. No.: 10/242,156

(22) Filed: Sep. 12, 2002

(65) Prior Publication Data

US 2003/0085659 A1   May 8, 2003

Related U.S. Application Data

(60) Provisional application No. 60/325,905, filed on Sep. 28, 2001.

(51) Int. Cl.
*G03B 21/16* (2006.01)
*G03B 21/18* (2006.01)
*G02F 1/1333* (2006.01)
*H05K 7/20* (2006.01)
*F28F 7/00* (2006.01)

(52) U.S. Cl. .................. 353/52; 353/119; 353/122; 349/161; 361/704; 165/185

(58) Field of Classification Search ............... 353/52, 353/119, 122; 349/161; 361/704, 386; 165/185, 165/80.2
See application file for complete search history.

(56) References Cited

U.S. PATENT DOCUMENTS

| | | | | | |
|---|---|---|---|---|---|
| 4,298,904 | A | * | 11/1981 | Koenig ..................... | 361/720 |
| 4,751,963 | A | * | 6/1988 | Bui et al. ................. | 165/80.2 |
| 5,991,153 | A | * | 11/1999 | Heady et al. ............. | 361/704 |
| 6,246,582 | B1 | * | 6/2001 | Habing et al. ............ | 361/704 |
| 6,257,328 | B1 | * | 7/2001 | Fujiwara et al. .......... | 165/185 |
| 6,428,170 | B1 | * | 8/2002 | Haba ........................ | 353/119 |
| 6,447,121 | B1 | * | 9/2002 | Woo .......................... | 353/52 |
| 6,540,364 | B1 | * | 4/2003 | Takizawa et al. ......... | 353/61 |

\* cited by examiner

*Primary Examiner*—Melissa Jan Koval
(74) *Attorney, Agent, or Firm*—Charles A. Brill; Wade James Brady, III; Frederick J. Telecky, Jr.

(57) ABSTRACT

A method and mechanism for cooling a display device, having an extremely bright light focused on its surface and is mounted inside a closed chassis, by conducting heat from the device directly to the chassis walls, where the heat is then transferred to the lower temperature air of the ambient surroundings. The mechanism uses an adjustable mechanical linkage to close the gap and make a good thermal contact between the projection device package or heat sink stud and the chassis wall. This approach reduces the requirements for large heat sinks and noisy cooling fans found in many conventional projection systems.

28 Claims, 3 Drawing Sheets

US 7,077,526 B2

MECHANICALLY ADJUSTABLE THERMAL PATH FOR PROJECTION DISPLAY DEVICE COOLING

This application claims priority under 35 U.S.C. § 119(e)(1) of provisional application No. 60/325,905 filed Sep. 28, 2001.

FIELD OF THE INVENTION

The present invention relates to projection displays and more specifically to the cooling of the spatial light modulators used in such displays.

BACKGROUND OF THE INVENTION

Projection display systems tend to operate in a high temperature environment due to the internal lamp assembly used to provide illumination flux to the system. A particularly critical component is the spatial light modulator (SLM), such as a DMD or other micro-electro mechanical system device, where the illumination is focused on to its surface to be modulated and then reflected onto a display screen. It is essential that these devices be properly cooled to a specified operating temperature range for reliable, long life operation of the projector.

Traditionally, projection display devices have been cooled by attaching an air-cooled heat sink to the SLM. Heat dissipated in the SLM is then transferred to the air surrounding the heat sink, which is enclosed inside the projector chassis and often preheated by other components relative to the ambient air temperature outside the projector. A typical conventional cooling approach is shown in FIG. 1. An SLM package 100 with optically transparent cover glass 102 is mounted on a printed wiring board (PWB) 104. A metal heat sink stud 106 is attached to the bottom side of the SLM package and extended through a hole in the PWB 104. A heat sink 108, with fins to provide a large surface area, is attached to the stud 106 by a means that provides a good thermal interface. A fan 110 is mounted to blow air 116 across the heat sink, removing heat through convection, and out through vents 114 in the projector chassis 112. Even though outside air is brought into the enclosed chassis, it is preheated by the time it reaches the heat sink, and as a result the cooling effectiveness is limited.

Other methods conduct heat directly from the display device to the system's chassis wall so that heat is transferred from the chassis wall to the lower temperature ambient air surrounding the outside of the system. However, due to manufacturing tolerances in the parts, these approaches do not always provide optimal contact at the interfaces along the thermal path.

As projection systems become smaller, reducing the available space for cooling systems, and the light sources become brighter, improved display device cooling is required.

What is needed is an adjustable mechanism that allows the space between the SLM and the chassis wall to be tightly closed, thereby assuring a good thermal path. The solution of the present invention meets this need by providing a direct thermal path between the SLM package and the chassis wall, which consists of an adjustable mechanical linkage. Multiple embodiments of adjustable mechanical linkages are disclosed herein.

SUMMARY OF THE INVENTION

The present invention discloses a method and mechanical adjustable mechanism for cooling a display device. The display device, typically a spatial light modulator such as a micromirror device, has extremely bright light focused on its surface and is mounted inside a closed case or chassis. The mechanically adjustable thermal path conducts heat from the display device directly to the system's chassis wall where the heat is then transferred to the lower temperature ambient air. Providing a reliable mechanical conductive path reduces or eliminates the need for large heat sinks and noisy cooling fans found in many conventional projection systems.

The method uses an adjustable mechanical linkage to close the gap between the display device package, or a heat sink stud attached to the package, and the chassis wall. This provides a good thermal path for the heat to conduct out of the display device and then transfer to the lower temperature ambient air.

According to one embodiment of the present invention, two wedges are positioned to take up the variation in the gap and thereby provide good thermal contact between the display device and the chassis wall. Care is taken to fabricate all mechanical parts along the adjustable thermal path out of thermally conductive material. Thermal grease or other thermal interface substance may be used at all mechanical interfaces.

According to another embodiment of the present invention, a method for transferring heat from a component mounted on a printed wiring board inside a closed chassis to ambient air outside the chassis is provided. The method comprising: providing the component; providing the chassis; and coupling the component to a wall of said chassis by means of an adjustable thermal linkage thereby providing a thermal path between the component and the chassis.

According to yet another embodiment of the present invention, a spatial light modulator projection display system is provided. The display system comprising: a light source for producing a beam of light along a first light path; a spatial light modulator for receiving and modulating the light along the first light path; a system chassis; and an adjustable thermal linkage between the spatial light modulator and the system chassis for conducting heat from the spatial light modulator to the system chassis.

BRIEF DESCRIPTION OF THE DRAWINGS

For a more complete understanding of the present invention, and the advantages thereof, reference is now made to the following descriptions taken in conjunction with the accompanying drawings, in which:

FIG. 6b is a perspective view of the threaded device of FIG. 6a.

DETAILED DESCRIPTION OF THE PREFERRED EMBODIMENTS

This invention discloses a method and mechanism for cooling a display device by conducting heat from the device to the chassis walls where the heat is then transferred to the lower temperature air of the ambient surroundings. This approach reduces or reduces the need for large heat sinks and noisy cooling fans found in many conventional projection systems. The mechanism uses an adjustable mechanical linkage to bridge the gap between the projection device package and the chassis wall. The adjustable mechanical linkage provides good thermal contact between the projection device package and the chassis wall to enable heat to be conducted to the chassis wall.

Figure 2A:
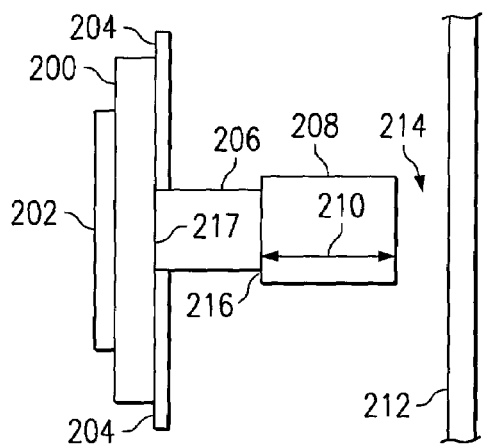
FIGS. 2a and 2b are internal views of a portion of a projection display system illustrating the concept of the present invention for removing heat by conduction from a projection device by means of an adjustable mechanical linkage, to take up the tolerance between the projection device package and the wall of the chassis, and then by transferring heat to the lower temperature ambient air.

FIG. 2a illustrates the concept of the adjustable cooling mechanism of the present invention. This shows the mechanical linkage in an inactivated state, before it has been adjusted. The display device package 200, which usually contains an SLM covered by an optically transparent cover glass 202, is mounted on a printed wiring board (PWB) 204. An adjustable mechanical linkage 208 contacts an optional heat sink stud 206 at interface 216, or contacts the device package 200 directly at interface 217. The linkage 208 is placed between the device package 200, or the stud 206, and the wall 212, and is adjusted to make its length 210 longer to close the gap 214.

Figure 2B:
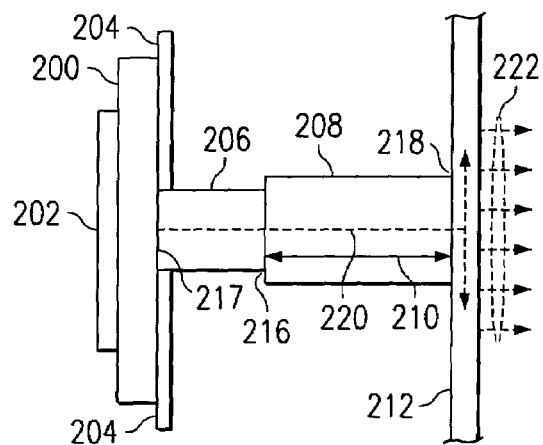

FIG. 2b shows the mechanism of FIG. 2a adjusted in length 210 to bridge the gap between the display device package 200 and the chassis wall 212. Optionally, a heat sink stud 206 can be inserted between the device package 200 and the mechanical linkage 208.

Figure 1:
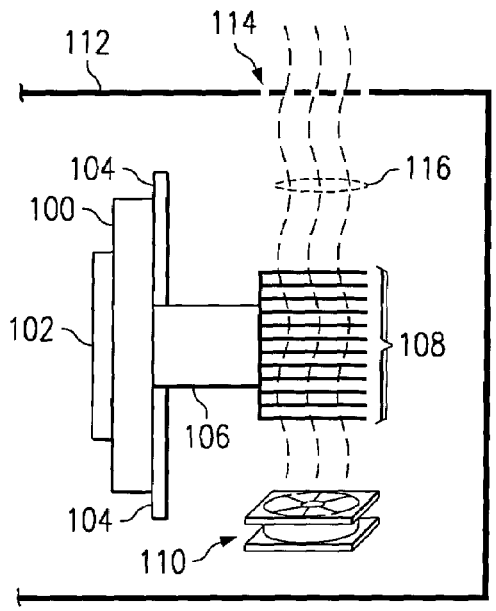
FIG. 1 is an internal side view of a portion of a projection display system showing the prior art convection cooling technique using conventional heat sinks and a fan blowing air across the heat sink to remove heat from the light modulator.

Thermal studs are widely used in prior art embodiments such as that shown in FIG. 1. The present invention is used either with or without a thermal stud simply by extending the thermal linkage from the chassis wall to the component rather than the thermal stud. It should be recognized whenever the following description references an embodiment using the thermal stud that the same invention is applicable to similar embodiments without the thermal stud. Therefore, the thermal stud is considered part of the package being cooled.

Once thermal contact has been made at the device package or stud and wall interfaces 216 or 217 and 218, heat from the display device is conducted 220 along this thermal path and out into the chassis wall 212, where it is then transferred 222 to the lower temperature ambient air, thereby effectively removing heat from the display device. All the metal parts along the critical heat path are fabricated from high thermal conductivity materials such as aluminum, aluminum alloys, magnesium, and magnesium alloys. Thermal grease or other thermal interface substance may be used at all mechanical interfaces along the path, although metal-to-metal contact may provide an adequate thermal path in some cases.

Figure 3A:
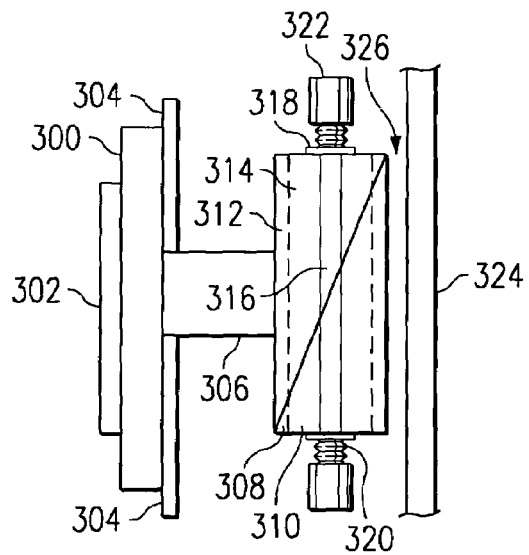
FIGS. 3a and 3b are internal views of a portion of a projection display system showing one embodiment of the present invention in which an adjustable linkage is comprised of two wedges positioned to expand to bridge the gap
Figure 3B:
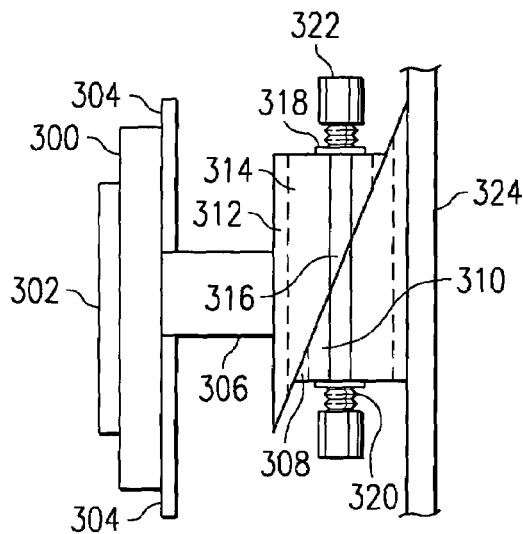

FIGS. 3a and 3b are drawings showing the adjustable linkage for another embodiment of the present invention, where the adjustable linkage is comprised of two wedges that are positioned to bridge the gap and make good thermal contact between the device package and the chassis wall. FIG. 3a shows the adjustable linkage in an inactivated state. The assembly is comprised of a display device package 300 with an optically transparent cover glass 302 mounted on a PWB 304. The wedges 308 and 312 are placed between the device package 300, or optional stud 306, and the chassis wall 324. The two wedges 308 and 312 have slots 310 and 314, respectively, extending through their length. One wedge 312 contacts the device package 300, or heat sink stud 306, optionally using a thermal grease or other thermal contact means. The other wedge 308 is placed against the first wedge 312, along the hypotenuse of the triangular shaped wedges, so that the two wedges line up at the two ends. A fastener, typically bolt 316, is then inserted through the slots 310 and 314 and washers 318, springs 320, and nuts 322 are installed on each end of the bolt 316 to properly hold the assembly in place. In this inactivated state, there is a gap 326 between the backside of the second wedge 308 and the chassis wall 324.

FIG. 3b shows the mechanism of FIG. 3a after the springs 320 have been adjusted to provide force on the wedges causing one to slide along the other until the gap 326 is closed, completing the thermal contacts at the interfaces along the thermal path. To adjust the thermal linkage, the nuts 322 on bolt 316 are loosened and wedge 308 is moved in an upward direction until the backside of the wedge makes firm contact with the chassis wall 324. The nuts 322 are then tightened, compressing the springs 320, to hold the assembly in place. Alternatively, bolt 316 can be fabricated with a fixed head at one end and a nut at the opposite end. Heat is then transferred from the chassis wall to the lower temperature of the ambient air surrounding the chassis. All the metal parts along the critical heat path are fabricated from high thermal conductivity materials such as aluminum, aluminum alloys, magnesium, and magnesium alloys. Thermal grease or other thermal interface substance may be used at all mechanical interfaces along the path.

Figure 4:
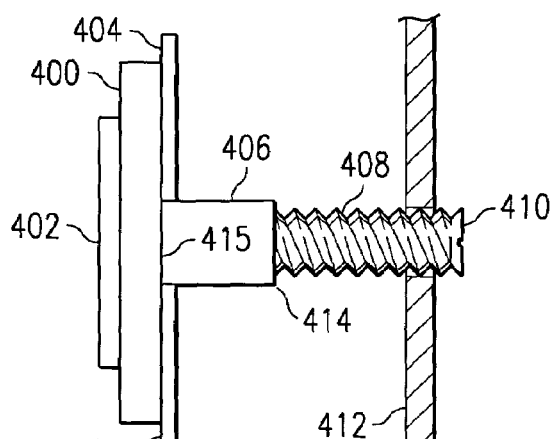
FIG. 4 is an internal view of a portion of a projection display system illustrating a second embodiment of the present invention in which a metal screw is threaded through the wall of the chassis to bridge the gap and make good thermal contact between the light modulator package and the display system chassis wall.

FIG. 4 is a drawing showing the adjustable linkage for a second embodiment of the present invention, where a metal screw 408 is threaded through the wall 412 of the chassis to bridge the gap and make good thermal contact between the device package 400 and the chassis wall 412. In this case, the mechanism is comprised of the display device package 400, with optical transparent cover glass 402, mounted on a PWB 404. The adjustable screw linkage 408 extends through a hole in the PWB 404 making contact with the device package 400, or optionally with a heat sink stud 406. The adjustable link 408 is then adjusted by means of a screwdriver slot 410 by turning the link in a direction to close the gap between the device package 400 or stud 406 and the flat end of the linkage 408 until the two come in contact at the stud interface 414 or the package interface 415 to create a thermally conductive path between the display device package 400 and the chassis wall 412. Heat is then transferred from the chassis wall to the lower temperature ambient air surrounding the chassis. All the metal parts along the critical heat path are fabricated from high thermal conductivity materials such as aluminum, aluminum alloys, magnesium, and magnesium alloys. Thermal grease or other thermal interface substance may be used at all mechanical interfaces along the path.

Figure 5:
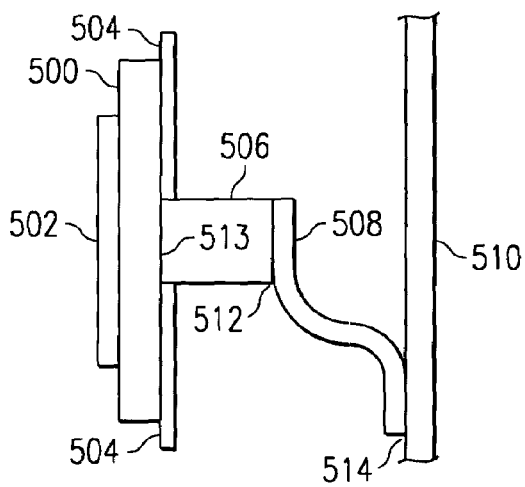
FIG. 5 is an internal view of a portion of a projection display system showing a third embodiment of the present invention in which a flexible link is used to bridge the gap and make good thermal contact between the light modulator package and the display system chassis wall.

FIG. 5 is a drawing showing a third embodiment of the present invention, in which a flexible bent metal linkage 508 is used to bridge the gap and make good thermal contact between the device package 500 and the chassis wall 510. The assembly is comprised of the display device package 500 with an optically transparent cover glass 502 mounted on a PWB 504. In this case, the flexible linkage 508 is attached to the device package 500 or optional heat sink stud 506 at one end 513/512, respectively, or to the chassis wall 510 at the other end 514. The linkage extends through a hole in the PWB 504 located just below the device package 500. The linkage 508 may have spring-loaded properties, which assures firm contact at the chassis wall or device package interface, or it may be attached at both ends and be flexible in the middle. For example, in one configuration the metal linkage 508 is spring loaded at one end against either the chassis wall 510 or the device package 500 to create a thermal path between the display device package 500 and the chassis wall 510. Heat is then transferred from the higher temperature chassis wall to the relatively lower temperature ambient air. In a second configuration, the linkage 508 is attached at one end to the device package 500 or the stud 506 and at the other end to the chassis wall 510. As with the other embodiments, all the metal parts along the critical heat path are fabricated from high thermal conductivity materials such as aluminum, aluminum alloys, magnesium, and magnesium alloys. Thermal grease or other thermal interface substance may be used at all mechanical interfaces along the path.

Figure 6A:
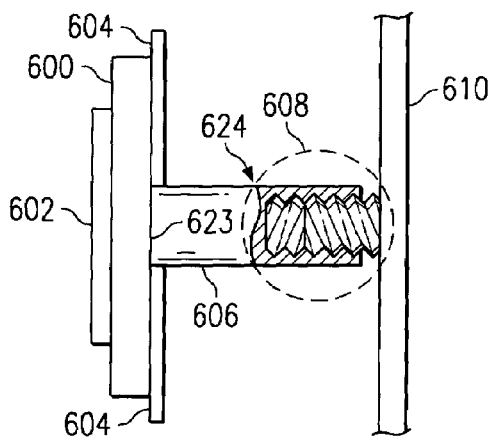
FIG. 6a is an internal view of a portion of a projection display system showing a fourth embodiment of the present invention in which a threaded device is used to bridge the gap and make good thermal contact between the light modulator package and the chassis wall.
Figure 6B:
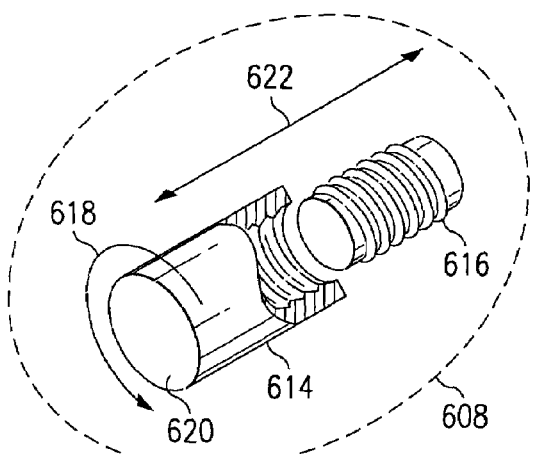

FIGS. 6a and 6b are perspective views showing a fourth embodiment of the present invention. In FIGS. 6a and 6b, a threaded device 608 is used to bridge the gap and make good thermal contact between the device package 600 and the chassis wall 610. The front-end of this embodiment is the same as the other embodiments, which is comprised of a display device package 600 with an optically transparent cover glass 602 mounted to a PWB 604. Again, the PWB 604 has a hole through which contact is made with the device package 600. As shown in FIG. 6b, the threaded device 608 consists of an internally threaded portion 614 and an externally threaded portion 616. Both the internally threaded portion 614 and the externally threaded portion 616 typically are cylindrical. In FIG. 6a the externally threaded portion 616 contacts the chassis wall 610, although the threaded device 608 may be reversed so that the internally threaded portion 614 contacts the chassis wall 610.

To bridge the gap between the heat sink stud 606 and the chassis wall 610, the threaded device 608 is expanded in length 622 by rotating 618 the internally threaded portion 614 relative to the externally threaded portion 616 until firm contact is made at interface 623/624 between the flat end surface 620 of the externally threaded portion 614 and the device package 600 or optional heat sink stud 606, thereby creating a thermal path between the device package 600 and the chassis wall 610. Optionally, the threaded device 608 can make direct contact with the device package 600, eliminating the need for the heat sink stud 606. As in the case of the other embodiments, all the metal parts along the critical heat path are fabricated from high thermal conductivity materials such as aluminum, aluminum alloys, magnesium, and magnesium alloys. Thermal grease or other thermal interface substance may be used at all mechanical interfaces along the path.

Figure 7:
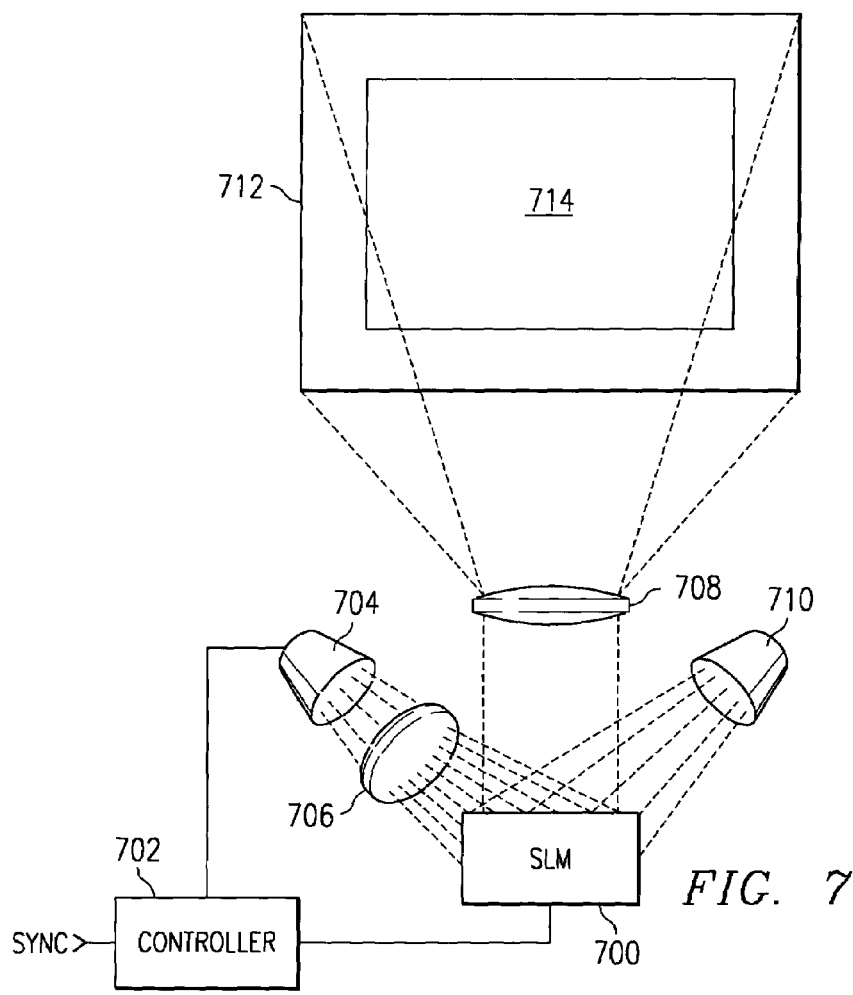
FIG. 7 is a schematic drawing of a high-performance, high-reliability, projection display system, which incorporates the projection device cooling mechanism of the present invention to conduct heat from the projection device to the display system's chassis wall by means of an adjustable mechanical linkage.

FIG. 7 is a block diagram of a projection display, which incorporates the method of the present invention for cooling the SLM in the projector. In this system, a high-level illumination flux from a lamp 704 is focused through a condensing lens 706, along a first light path on to an SLM 700 where it is modulated and reflected off the surface of the individual pixels. If the pixels are turned ON, the light is reflected along a second light path, through a projection lens 708 on to a display screen 712 to present a well-focused image 714. If the pixels are OFF, the light is reflected along a third light path, out of the aperture of the projection lens 708, into a light trap 710 and discarded. A controller 702 provides the electrical signals to both the lamp 704 and the SLM 700. The SLM is a small device on the order of one-half to one square inches in area with a very bright light beam focused on its surface. As a result, the device can be elevated to very high temperatures if a proper means for cooling is not provided. It is critical that the heat generated from the light source, as well a lesser amount of electrically generated heat internal to the device, be removed from the device to maintain a safe and usable operating range. In this case, heat from the SLM package is conducted out of the device package directly to the projector's chassis wall by closing the gap, between a heat sink stud mounted to the SLM package and the chassis wall, using the adjustable mechanical linkage method of the present invention, as described in the four embodiments discussed earlier.

Projection displays equipped with the SLM device cooling method of the present invention will be more reliable, and have a longer operating life.

Test results taken for the adjustable wedge linkage according to the embodiment of the present invention shown in FIGS. 3a and 3b are shown in Table 1.

TABLE 1

| | T_stud (° C.) | T_air (° C.) | Δ_T(° C.) |
|---|---|---|---|
| DMD/Stud only | 60.2 | 22.4 | 37.8 |
| Wedges with thermal grease | 43.8 | 22.9 | 20.9 |

Additionally, an example of thermal resistance data for a 4 Watt thermal load is shown in Table 2.

TABLE 2

| Heat (W) | T_device (° C.) | T_stud (° C.) | T_wedge 1 (° C.) | T_wedge 2 (° C.) | T_wall (° C.) |
|---|---|---|---|---|---|
| 4.0 | 38.5 | 33.7 | 32.1 | 30.9 | 28.3 |

In this example, where the adjustable thermal linkage of the present invention is used with 4.0 watts of heat dissipation, a temperature differential from stud to chassis wall of 33.7−28.3=5.4° C. and a thermal resistance of 5.4° C./4.0 W=1.35° C./W were measured.

While this invention has been described in the context of several embodiments, it will be apparent to those skilled in the art that the present invention may be modified in numerous ways and may assume embodiments other than that specifically set out and described above. Accordingly, it is intended by the appended claims to cover all modifications of the invention that fall within the true spirit and scope of the invention.

What is claimed is:

1. A method for transferring heat from a component mounted on a printed wiring board inside a closed chassis to the chassis, said method comprising:
   providing said component;
   providing said chassis; and
   coupling said component to a wall of said chassis using a mechanically adjustable thermal linkage thereby providing a thermal path between said component and said chassis, said thermal linkage comprising at least one threaded member operable to adjust a dimension of said thermal linkage, said thermal path passing from said component to said thermal linkage without passing through a circuit board.

2. The method of claim 1, said providing said component step comprising;
   providing said component comprising a device and a metal stud attached to a surface of said device, said metal stud coupled to said wall of said chassis by means of said adjustable thermal linkage.

3. The method of claim 1, said providing said component step comprising:
   providing a spatial light modulator.

4. The method of claim 1, said providing said component step comprising:
   providing a micro-electro mechanical system device.

5. The method of claim 1, said providing said component step comprising:
   providing a digital micromirror device.

6. The method of claim 1, said coupling step comprising:
   coupling said component to a wall of said chassis by means of said adjustable thermal linkage fabricated from a group of thermally conductive materials consisting of aluminum, aluminum alloys, magnesium, and magnesium alloys.

7. The method of claim 1, said coupling step comprising:
   coupling said component to a wall of said chassis by means of said adjustable thermal linkage wherein a thermal interface substance is used at least one contact interface on a thermal path including said adjustable linkage.

8. The method of claim 1, said coupling step comprising:
   coupling said component to a wall of said chassis by means of said adjustable thermal linkage wherein said adjustable linkage takes up the tolerance between said stud and said chassis wall.

9. The method of claim 1, said coupling step comprising:
   coupling said component to a wall of said chassis by means of said adjustable thermal linkage comprising a fastener and two metallic wedges positioned between said component and said chassis wall, said wedges having lengthwise openings and said fastener in said openings to adjust a position of at least one of said metallic wedges.

10. The method of claim 9, said coupling step comprising:
    coupling said component to a wall of said chassis by means of said adjustable thermal linkage comprising a bolt and two metallic wedges positioned between said component and said chassis wall, said wedges having lengthwise openings and said bolt in said openings to adjust a position of at least one of said metallic wedges, wherein said bolt has a fixed head at one end and a screw-on nut at the opposite end, said bolt extending through said openings of said wedges; and having a washer and spring installed at each end of said bolt under said bolt head and said nut to apply pressure on said wedges, thereby holding said wedges in place.

11. The method of claim 9, said coupling step comprising:
    coupling said component to a wall of said chassis by means of said adjustable thermal linkage comprising a bolt and two metallic wedges positioned between said component and said chassis wall, said wedges having lengthwise openings and said bolt in said openings to adjust a position of at least one of said metallic wedges, wherein said bolt has a screw-on nut at each end, said bolt extending through said openings of said wedges, thereby holding said wedges in place.

12. The method of claim 9, said coupling step comprising:
    coupling said component to a wall of said chassis by means of said adjustable thermal linkage comprising a bolt and two metallic wedges positioned between said component and said chassis wall, said wedges having lengthwise openings, said bolt engaging threads in one said opening to adjust a position of at least one of said metallic wedges.

13. The method of claim 1, said coupling step comprising:
    coupling said component to a wall of said chassis by means of said adjustable thermal linkage comprising a metal screw extended through a threaded hole in said chassis wall, said screw having a flat surface at one end, said screw being rotated to bring said flat surface in contact with said stud, thereby making thermal contact between said component and said chassis wall.

14. The method of claim 1, said coupling comprising:
    coupling said component to a wall of said chassis by means of said adjustable thermal linkage comprising a flexible spring for applying firm pressure between said component package or said stud and said chassis, one end of said spring against said component, another end of said spring against said chassis wall, thereby creating a thermal path between said component and said chassis.

15. The method of claim 1, said coupling comprising:
    coupling said component to a wall of said chassis by means of said adjustable thermal linkage comprising a flexible device attached at one end to said component and at another end to said chassis wall, thereby creating a thermal path between said component and said chassis.

16. The method of claim 1, said coupling step comprising:
    coupling said component to a wall of said chassis by means of said adjustable thermal linkage comprising a internally threaded portion and an externally threaded portion, internally threaded portion and said externally threaded portions rotated relative to each other to apply pressure between said stud and said chassis wall, thereby creating a thermal path between said component and said chassis.

17. A spatial light modulator projection display system, comprising:
    a light source for producing a beam of light along a first light path;
    a spatial light modulator for receiving and modulating said light along said first light path;
    a system chassis; and
    a mechanically adjustable thermal linkage between said spatial light modulator and said system chassis for conducting heat from said spatial light modulator to said system chassis, said thermal linkage comprising at least one threaded member operable to adjust a dimension of said thermal linkage, said thermal path passing from said component to said thermal linkage without passing through a circuit board.

18. The system of claim 17, said adjustable thermal linkage fabricated from a group of thermally conductive materials consisting of aluminum, aluminum alloys, magnesium, and magnesium alloys.

19. The system of claim 17, comprising:
   a thermal interface substance at contact interfaces between parts along a thermal path between said spatial light modulator and said system chassis.

20. The system of claim 17, said adjustable thermal linkage bridging a gap between said spatial light modulator and said system chassis to create a thermal path from said spatial light modulator to said system chassis.

21. The system of claim 17, said adjustable thermal linkage comprising:
   two metallic wedges having lengthwise slots, said wedges being positioned to fill a gap between said spatial light modulator and said system chassis;
   a bolt having a fixed head at one end and a screw-on nut at the opposite end, extending through said slots of said wedges; and
   a washer and spring installed at each end of said bolt under said head and said nut to apply pressure on said wedges, thereby holding said wedges in place.

22. The system of claim 21, wherein said bolt has removable nuts at both ends.

23. The system of claim 17, said adjustable thermal linkage comprising:
   metallic wedges positioned to fill a gap between said spatial light modulator and said system chassis; and
   a fastener holding said wedges in place against said spatial light modulator and said system chassis.

24. The system of claim 23, wherein said fastener is a bolt and nut.

25. The system of claim 23, at least one of said wedges having a threaded opening, said fastener being a threaded fastener engaging said threaded opening.

26. The system of claim 17, wherein said adjustable thermal linkage comprises:
   a metal screw extended through a threaded hole in said chassis wall, said screw having a flat surface at one end, said screw being rotated to bring said flat surface in contact with said stud, thereby making thermal contact between said component and said chassis wall.

27. The system of claim 17, said adjustable thermal linkage comprising:
   a spring for applying firm pressure between said stud and said system chassis, one end of said spring associated wit said stud, another end of said spring associated with said system chassis.

28. The system of claim 17, said adjustable thermal linkage comprising:
   an internally threaded device; and
   an externally threaded device engaging said internally threaded device, said internally and externally threaded devices mutually coupled to apply pressure between said spatial light modulator and said system chassis.

* * * * *